United States Patent
Cathelin et al.

(10) Patent No.: US 7,623,837 B2
(45) Date of Patent: Nov. 24, 2009

(54) RECEIVER FOR AN INTEGRATED HETERODYNE COMMUNICATION SYSTEM INCLUDING BAW-TYPE RESONATORS

(75) Inventors: Andreia Cathelin, Laval (FR); Didier Belot, Rives (FR)

(73) Assignee: STMicroelectronics S.A., Montrouge (FR)

( * ) Notice: Subject to any disclaimer, the term of this patent is extended or adjusted under 35 U.S.C. 154(b) by 677 days.

(21) Appl. No.: 11/125,291

(22) Filed: May 9, 2005

(65) Prior Publication Data

US 2005/0266823 A1    Dec. 1, 2005

(30) Foreign Application Priority Data

May 10, 2004   (FR)  ................................. 04 05037

(51) Int. Cl.
*H04B 1/10*     (2006.01)
(52) U.S. Cl. .................. 455/307; 455/333; 455/339; 375/350
(58) Field of Classification Search ............... 455/255, 455/295, 296, 302, 307, 313, 323, 333, 339, 455/334; 375/327, 346, 350, 376
See application file for complete search history.

(56) References Cited

U.S. PATENT DOCUMENTS

| | | | |
|---|---|---|---|
| 5,963,856 A | 10/1999 | Kim | 455/307 |
| 6,112,070 A | 8/2000 | Katsuyama et al. | 455/307 |
| 6,542,724 B1 | 4/2003 | Copeland et al. | 455/302 |
| 6,653,913 B2 * | 11/2003 | Klee et al. | 333/188 |
| 6,799,027 B1 * | 9/2004 | Forster | 455/313 |
| 6,952,594 B2 * | 10/2005 | Hendin | 455/307 |
| 7,194,247 B2 * | 3/2007 | Tikka et al. | 455/339 |

FOREIGN PATENT DOCUMENTS

FR     2864729     7/2005

OTHER PUBLICATIONS

Pärssinen, Aarno, *Direct Conversion Receivers in Wide-Band Systems*, Kluwer Academic Publishers, Dordrecht, The Netherlands, 2001.
De Los Santos, Héctor J., *RF MEMS Circuit Design for Wireless Communications*, Artech House, Boston, Massachusetts, 2002, p. 163.

* cited by examiner

*Primary Examiner*—Quochien B Vuong
(74) *Attorney, Agent, or Firm*—Lisa K. Jorgenson; Eric M. Ringer; Seed IP Law Group PLLC

(57) ABSTRACT

A heterodyne receiving circuit for a digital communication system including a first band pass filter receiving a signal from an antenna, an amplifying circuit and a second narrow band pass filter for selecting one particular channel within a band of frequencies. The two filters are carried out with integrated BAW-type tunable resonators which can be adjusted, respectively, by a first electrical signal and a second electrical signal generated by two PLL-type frequency control loops. The second frequency control loop has a variable division factor for the purpose of selecting one particular channel within said band of frequencies. In addition, the receiving circuit includes a mixer for mixing the signal generated at the output of said second filter with a local oscillation frequency in order to produce an intermediate frequency. The division factor is controlled by a digital processing of the intermediate frequency.

30 Claims, 11 Drawing Sheets

For an given chip and a predetermined temperature this filter has fixed characteristics This filter is tunable controlled in accordance with the particular channel to be selected The profile of the filters remains unchanged

RECEIVER FOR AN INTEGRATED HETERODYNE COMMUNICATION SYSTEM INCLUDING BAW-TYPE RESONATORS

BACKGROUND OF THE INVENTION

1. Field of the Invention

The present invention relates to the field of electronic circuits used in data transmission, and more particularly a receiver for an integrated heterodyne communication system including BAW type resonators.

2. Description of the Related Art

The heterodyne architecture was developed in the beginning of the XXth century for the purpose of improving wireless communication. Such architecture is still used in the more recent mobile receivers: mobile telephones, so-called pagers, 433 Mhz receivers etc. . . .

The principle of the heterodyne architecture is shown in FIG. 1, where a low noise amplifier 12 receives a Radio Frequency (RF) signal generated by an antenna 11 and operating at a frequency $f_{RF}$. A filtering element 13 is inserted between amplifier 12 and a frequency mixer 14. The frequency mixer brings back the RF signal to another frequency which is generally designated by the expression Intermediate Frequency $f_{IF}$, thanks to a mixing with a reference signal $f_{OL}$ generated by a local oscillator (LO). This permits the signal to be processed at the Intermediate Frequency $f_{IF}$.

Assuming that $f_{OL}<f_{RF}$, the following relation is true: $f_{RF}=f_{OL}+f_{IF}$. The same reasoning could be followed for the case where $f_{OL}<f_{RF}$.

Because the receiving antenna is a relatively wide band tuned circuit, other undesired interfering signals are inserted in the input of the LNA circuit, and particularly at the image frequency $f_{image}=f_{OL}-f_{IF}$.

Generally speaking, it is necessary to remove this image frequency which might interfere with the receipt of the RF signal. Practically, three methods are known for achieving such suppression.

A first method is based on the use of a filter for suppressing the image frequency, as represented by element 13 of FIG. 1. This filter is designed for providing a transfer function which lets all the signals go through at the exception of the image frequency which is substantially reduced. The expression "notch-filter" can refer to such method and, by extension, a heterodyne architecture which is based on this method of rejection is referred to as a Notch type architecture.

A second known method consists in using, not a notch filter, but a narrow band filter for leaving only the useful signals. With this second method, which is certainly better than the first method, all the non-useful signals, including the signals at the image frequency, are rejected. In practice, this method and the architecture using such method—which is generally designated by the expression "narrow band architecture" is a delicate task to achieve because of the difficulty of realizing a narrow band filter showing performance. And much more tricky to integrate in a semiconductor circuit.

In order to compensate for the above mentioned difficulty, a third method can be used or, should we say, a third category of methods which include numerous processing operations which permits to get rid with the problem of the image frequency. For instance, the homodyne type architecture is based on a direct conversion of the RF frequency. This third category further includes architectures of the type Low-IF involving a complex frequency processing, and also Hartley or Weaver type methods which are sometimes referred to as IQ architecture.

Generally speaking, the above evoked methods are discussed in the following document:

Aarno Pärssinen, 'Direct Conversion Receivers in Wide-band Systems', Kluwer Academic Publishers, 2001, which is incorporated by reference herein.

Now considering the case of the mobile telephone of the type Wide Band Code Division Multiplexing Access (WCDMA), the following frequencies are used:

for receiving: a 60 MHz frequency range between 2110 Mhz and 2170 Mhz;

for emitting: a 60 MHz frequency range between 1920 Mhz and 1980 Mhz.

There is a 5 Mhz frequency range which is assigned to one channel. The processing of one channel, in a known heterodyne type architecture, requires to suppress all non-desired signals, and particularly the image frequencies and, in addition, other high level signals at determined frequencies which are often referred to as "blocking" signals.

All these signals must be rejected or at least significantly reduced before they reach the mixer 14.

In most circuits of known WCDMA type mobile telephone, there is used an appropriate selective band pass filter which is located at the input of the mixer and realized by means of acoustic components of the type Surface Acoustic Wave (S.A.W.). These components have the drawback of not allowing easy integration in a same semiconductor product.

Downstream of this SAW filter, there is used a very selective filtering circuit for the purpose of suppressing the image frequency with a high level of rejection, generally at least 50 dB.

In the WCDMA standard, for instance, the band for the emission is 60 MHA and is divided into channels of 5 Mhz. The separation of these channels requires the use of selective filters fitted with quality factors having a value of at least several hundreds.

For W-CDMA transmission: $f_{center}=2140$ MHz, $B_{p\_channel}=5$ MHz.

$$Q=f_{center}/\Delta f|_{-3dB} \approx f_{center}/B_{p\_canal}=428.$$

For GSM transmission: $f_{center}=943$ MHz, $B_{p\_channel}=0.2$ MHz.

$$Q=f_{center}/\Delta f|_{-3dB} \approx f_{center}/B_{p\_channel}=4715.$$

The figures mentioned above are a clear obstacle preventing the use of the second method which was discussed before, because of the great difficulty of realizing filters for separating channels providing high selectivity at the radio frequency and, moreover, for providing a complete integration within a same semi-conductor product.

BRIEF SUMMARY OF THE INVENTION

One embodiment of the present invention achieves a receiving circuit based on a heterodyne architecture comprising a powerful narrow band filter for the purpose of suppressing the image frequency.

one embodiment of the present invention provides a high performance receiving circuit of a digital communication system which allows full integration within a single semiconductor substrate.

One embodiment of the present invention is a heterodyne receiving circuit for a digital communication system including a first band pass filter receiving a signal from an antenna, an amplifying circuit and a second narrow band pass filter for selecting one particular channel within a band of frequencies. The two filters are carried out with BAW-type tunable resonators which can be integrated and adjusted, respectively, by means of a first electrical signal and a second electrical signal generated by two PLL-type frequency control loops. The second frequency control loop has a variable division factor for the purpose of selecting one particular channel within said band of frequencies. The heterodyne architecture further comprises a mixer for the purpose of generating an intermediate frequency.

There is thus provided a heterodyne architecture supporting full integration in a semiconductor substrate.

In a preferred embodiment, the first band pass filter is carried out by means of a master/slave circuit including a slave circuit for generating the transfer function of said first filter and a master circuit which is integrated in the first frequency control loop.

More specifically, the slave circuit of the first filter includes a first BAW resonator having a resonance frequency and an anti-resonant frequency, said at least first BAW resonator being associated With a first partner element of the inductive type fixed in the vicinity of said resonant and anti-resonant frequencies; and with a second partner element of the capacitive type. At least one of the two elements is adjustable by means of said first electric signal.

The master circuit of the first filter includes a second BAW resonator located on the same substrate than said at least first BAW resonator, and having a resonance frequency and an anti-resonant frequency. The second BAW resonator is associated with a first partner element of the inductive type fixed in the vicinity of said resonant and anti-resonant frequencies and with a second partner element of the capacitive type. At least one of the two elements is adjustable by means of said first electric signal generated by the first frequency control loop.

The control of the characteristics of the resonators can be performed in various manners. Preferably, the capacitive element—which is for instance associated to the first BAW resonator—is a varactor controlled by said first electric signal (signal $1$, $V_{tune}$).

Preferably, the inductive element includes a spiral inductance located on the silicium substrate of the resonators.

Alternatively, the inductive element associated with the first or second resonator, includes a gyrator having two transconductance amplifiers and a capacitance, said first electric signal being used for controlling operating point of said transconductance amplifiers.

In another embodiment, the inductive element associated with the resonator includes a gyrator comprising to transconductance amplifiers an a varactor, said first electric signal being used for controlling the value of the capacitance of said varactor.

In a preferred embodiment, the second filter is carried out by means of a master/slave circuit including a slave circuit for generating the narrow band pass function of the second filter, and a master circuit which is integrated in the second control loop.

The slave circuit of the second filter comprises at least a first BAW resonator having a resonance frequency and an anti-resonant frequency, said at least first BAW resonator being associated with a first partner element of the inductive type fixed in the vicinity of said resonant and anti-resonant frequencies; and with a second partner element of the capacitive type. The at least said first BAW resonator is adjustable by means of said second electric signal.

The master circuit of the second filter comprises at least a second BAW resonator located on the same substrate than said at least first BAW resonator, and having a resonance frequency and an anti-resonant frequency. This at least second resonator is associated with a first partner element of the inductive type fixed in the vicinity of said resonant and anti-resonant frequencies; and with a second partner element of the capacitive type. At least one of the two partners elements is adjustable by means of said second electric signal and integrated in the second frequency control loop, which has an adjustable division factor for the selection of a desired channel.

As for the first filter, various manners will be used for acting upon the resonators of the master/slave circuit of the second filter.

For example, the first or second BAW resonator can be associated with a capacitive element of the type varactor controlled by said electric signal.

Preferably, the inductive element includes a spiral inductance located on the silicium substrate of said resonator.

Alternatively, the inductive element includes a gyrator having two transconductance amplifiers and a capacitance, said second electric signal being used for controlling operating point of said transconductance amplifiers. Also, the inductive element associated to said resonator includes a gyrator comprising to transconductance amplifiers an a varactor, said second electric signal being used for controlling the value of the capacitance of said varactor.

BRIEF DESCRIPTION OF THE SEVERAL VIEWS OF THE DRAWINGS

Other features, objects and advantages of the invention will best be understood by reference to the following detailed description when read in conjunction with the accompanying drawings, wherein.

Figure 4A:
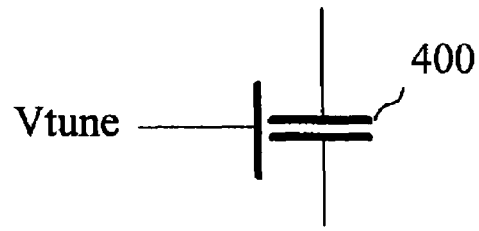
FIG. 4a illustrates tuning of said acoustic component by means of a varactor.
Figure 4B:
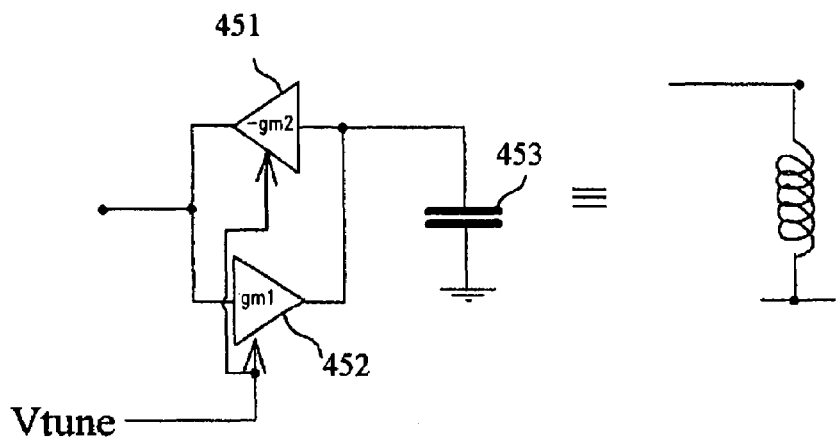
FIG. 4b illustrates the tuning of said adjustable acoustic component by means of an active inductor.
Figure 4C:
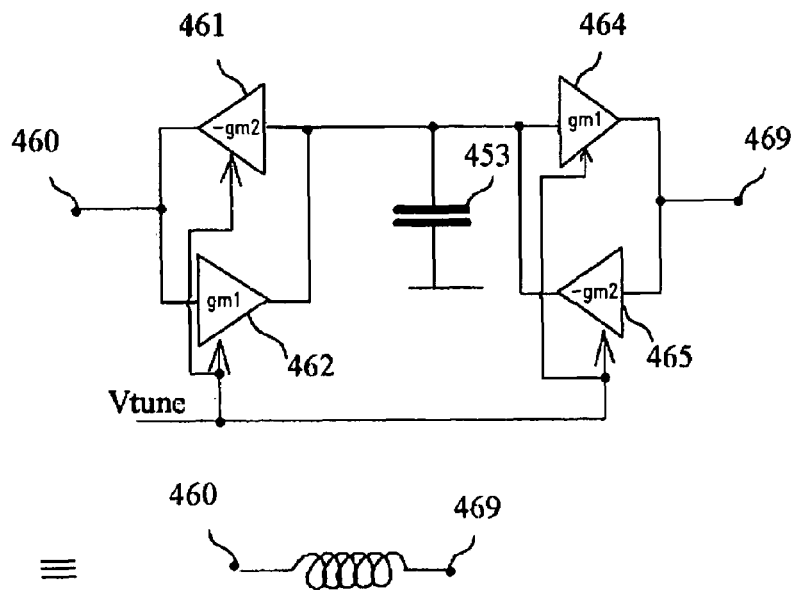

The FIG. 4c illustrates the tuning of said adjustable acoustic component by means of an active floating inductor.

Figure 5:
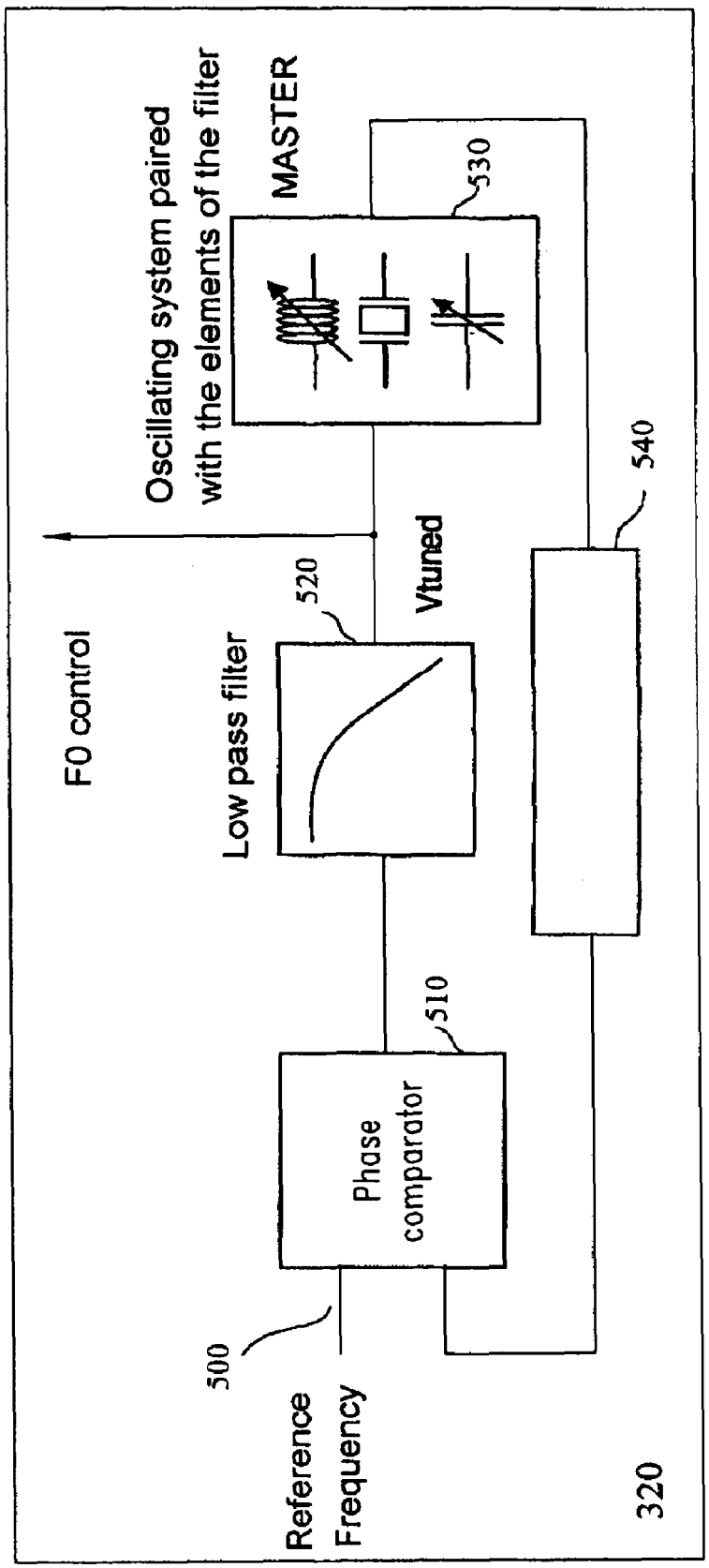

FIG. 5 illustrates a first feedback control chain—PLL-type—of a circuit including an adjustable acoustic component.

Figure 6:
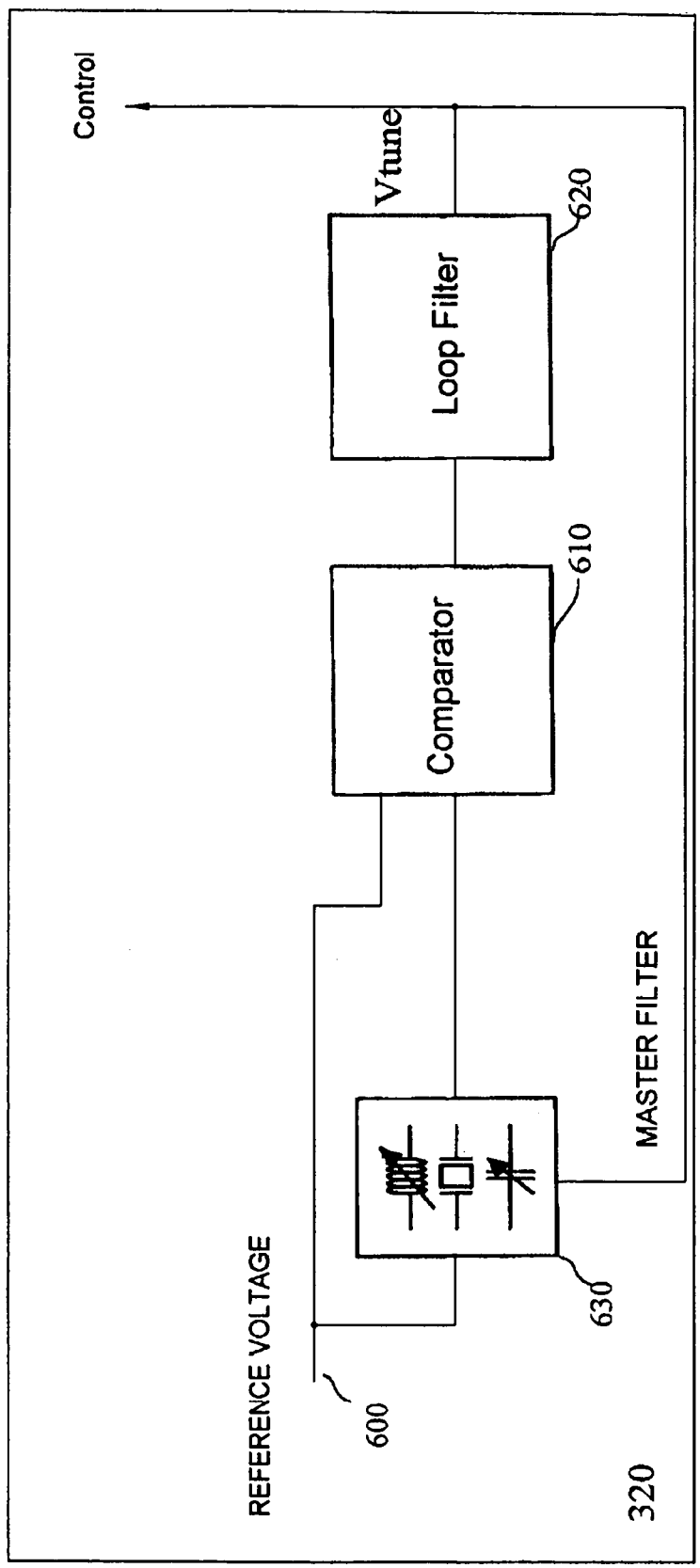

FIG. 6 illustrates a second feedback control chain—ALL-type—of a circuit including an adjustable acoustic component.

Figure 7:
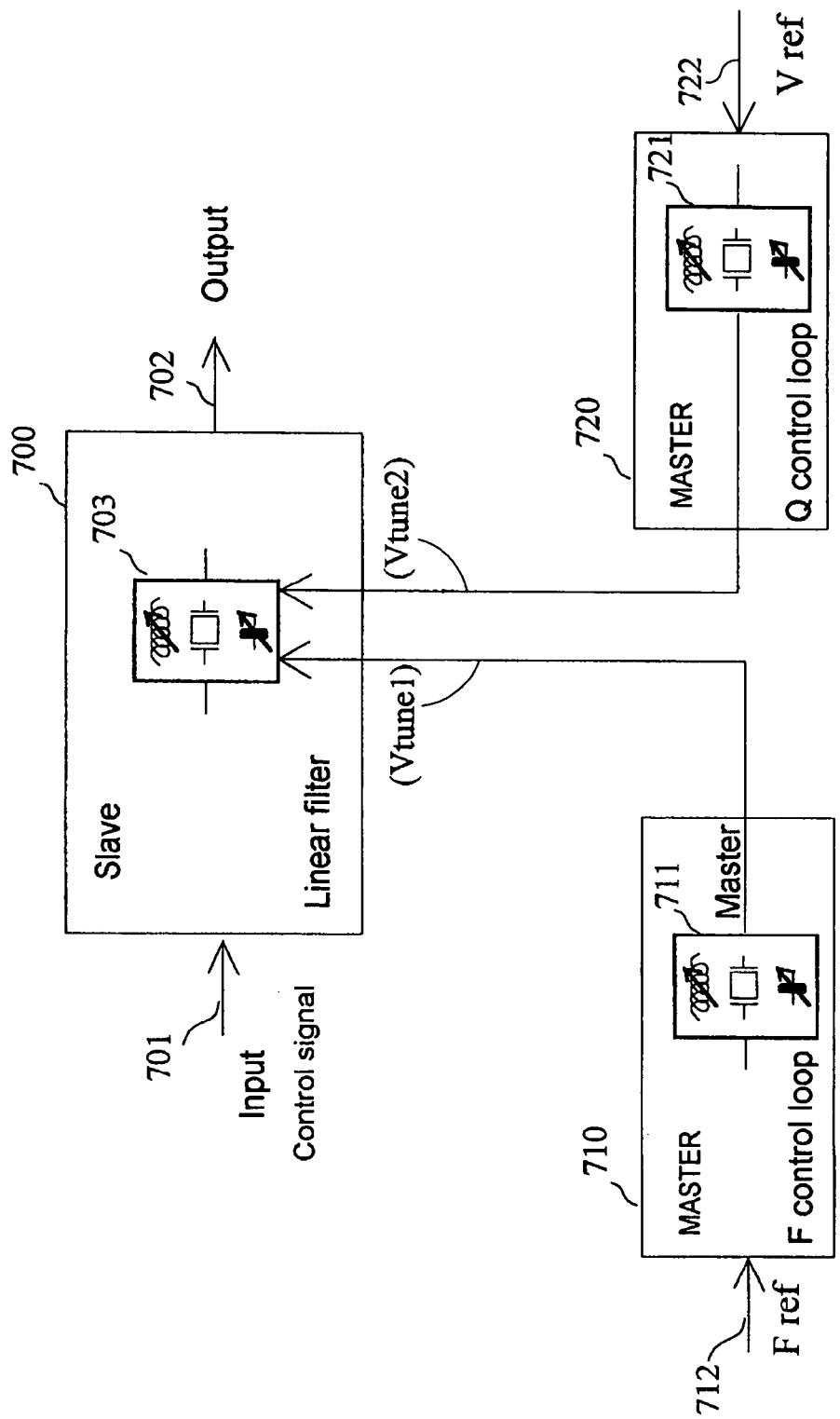

FIG. 7 illustrates a third example of a feedback control chain controlling a circuit including an adjustable acoustic component, systematically based on a PLL loop and an ALL loop.

Figure 8A:
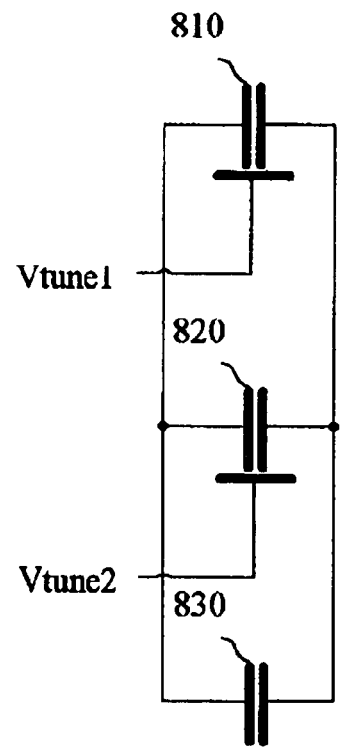
Figure 8B:
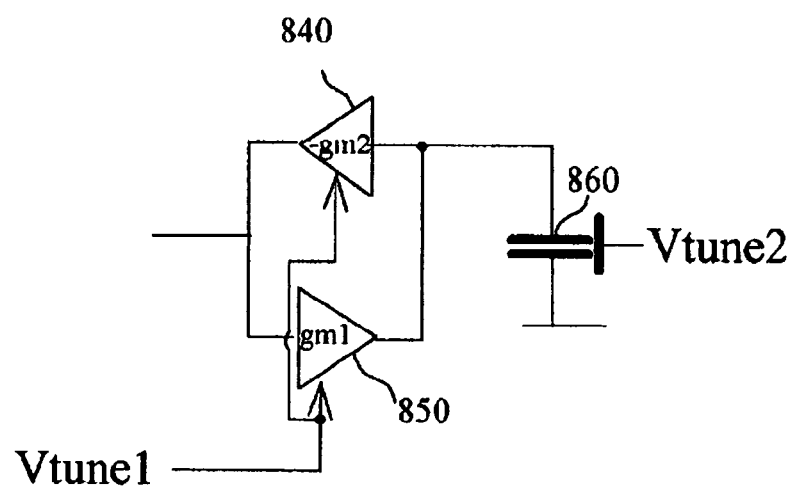

FIGS. 8a and 8b respectively describe two embodiments of the partner components associated with the adjustable resonator element.

Figure 9:
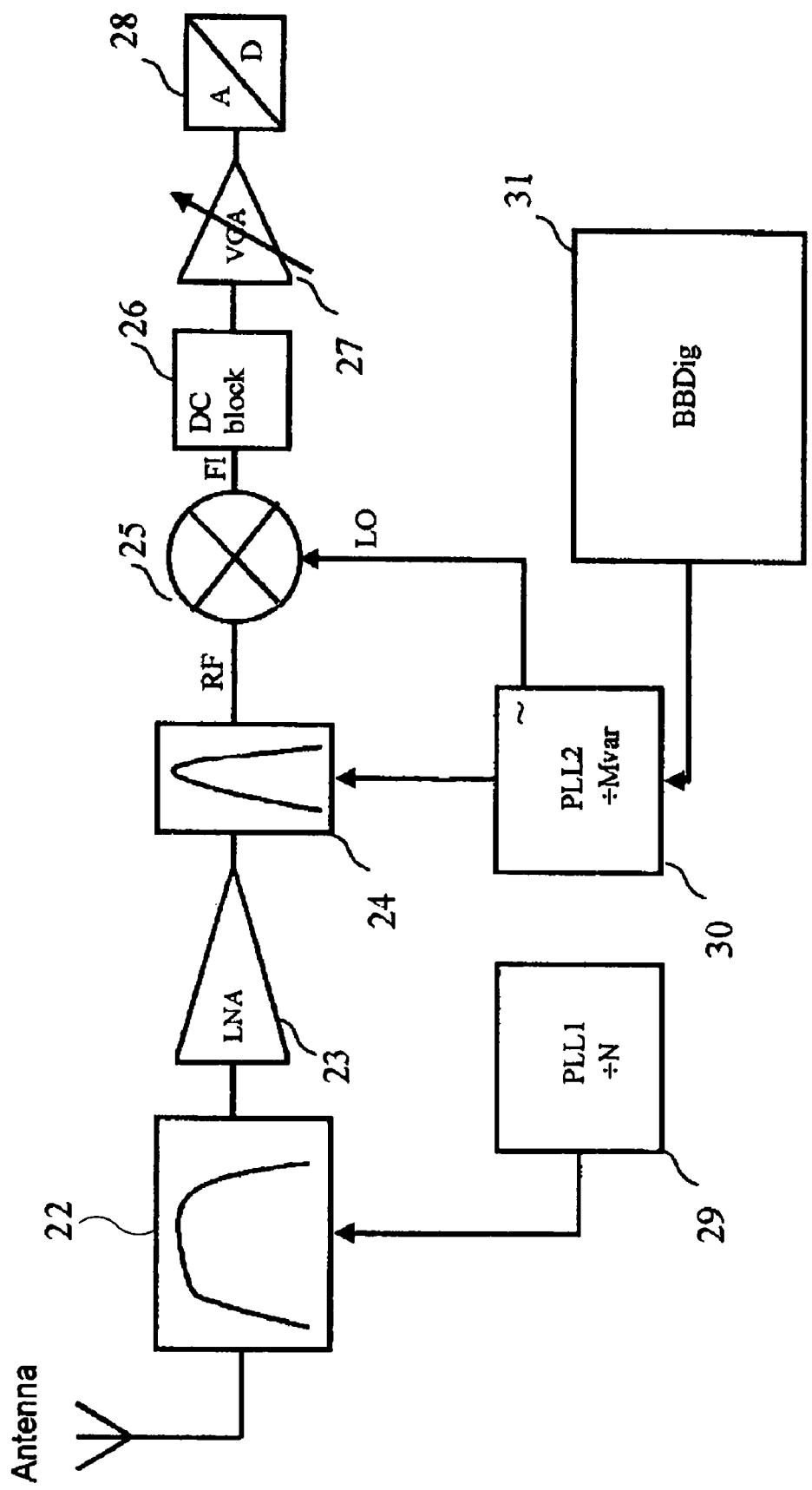

FIG. 9 illustrates the basic diagram of a receiving circuit based on a heterodyne architecture in accordance with the present invention.

Figure 10:
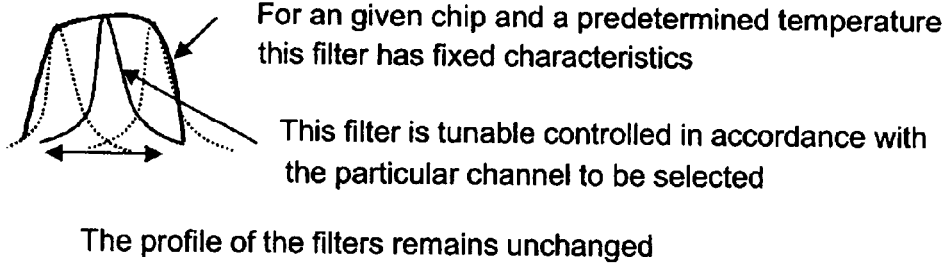

FIG. 10 illustrates the profile of the filters using BAW resonators.

Figure 11:
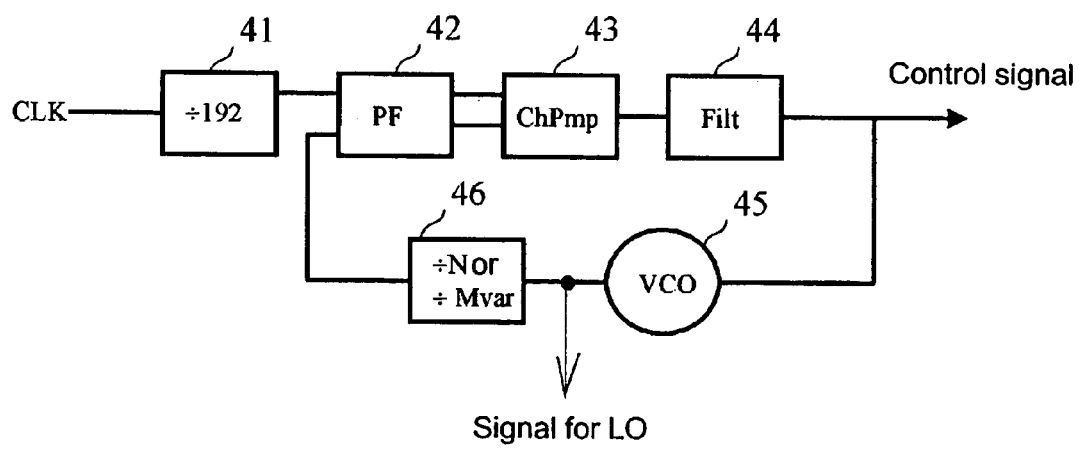

FIG. 11 illustrates a particular embodiment of the feedback control loop of the PLL type.

DETAILED DESCRIPTION OF THE INVENTION

We will now describe an embodiment of a heterodyne type architecture in accordance with the present invention which is particularly adapted to the design of a wireless data communication system, and particularly complying with the WCDMA standard.

This heterodyne architecture is based on the use of bulk acoustic wave (BAW) type elements and particularly a new tunable resonator component (TRC) (i) that can be easily integrated in a feedback control loop of the type Master/Slave (II) and allowing various possibilities of feedback control (III).

It can then be carried out a particularly effective heterodyne architecture which, moreover, can be completed integrated in a same integrated circuit (IV)

I. Integrable Tunable Resonator Component (TRC)

One embodiment of the invention is based on the use of a new acoustic component, hereafter designated by the expression tunable resonator component (TRC)—as described in French patent application No. 0315480 filed on Dec. 29, 2003, and the principal characteristics of which will be summarized hereafter—for clarity's sake.

To this end, an acoustic resonator based on a dielectric medium arranged on a reflecting element, such as a Bragg mirror or a receiver for example, is used. Layers having different acoustic properties and different dielectric constants are stacked on a silicon substrate. Such an acoustic element is known as a surface mounted resonator (SMR).

Alternatively, the resonator could be of the Film Bulk Acoustic Resonator type (FBAR), namely a resonator located above a cavity to allow the reflection of acoustic waves and to avoid damping thereof.

Figure 1:
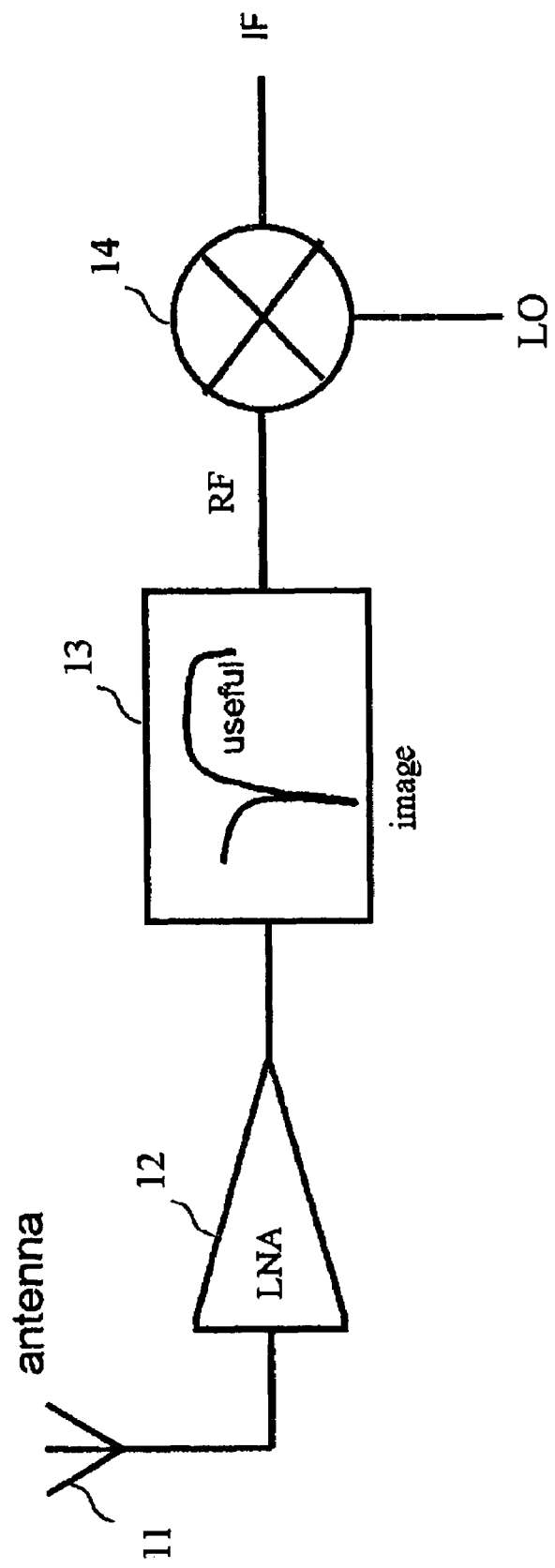
FIG. 1 illustrates the principle diagram of a heterodyne receiver for a digital communication system.
Figure 2A:
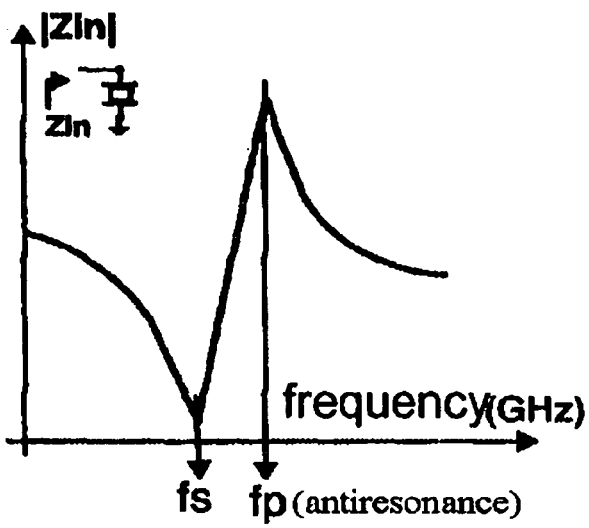
FIG. 2a illustrates an impedance curve of a BAW-type acoustic resonator.
Figure 2B:
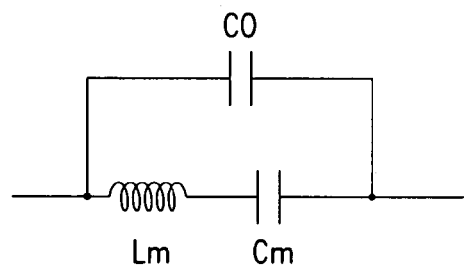
FIGS. 2b and 2c show the equivalent electric diagram of a BAW-type acoustic resonator, respectively in series and parallel.

A BAW resonator has two very close resonant frequencies, $f_s$ (series) and $f_p$ (parallel) respectively, as illustrated in FIG. 2a. When referring to an equivalent electric diagram shown in FIG. 2b, it amounts to considering two LC-type resonator circuits, series and parallel respectively, composed of elements Lm, Cm and C0.

In the known approach, both resonant circuits are simultaneously used for filtering, as it is the case in document <<*RF MEMS Circuit Design for Wireless Communications*>>, Hector J De Los Santos, Artech House, ISBM 1-58033 329-9, 2002, p. 163 and following, for example.

On the contrary, in the new approach that is proposed, the TRC comprises a BAW resonator which is associated with at least two partner elements and, preferably, with a first inductive partner element, variable or fixed, active or passive, and with a second, generally variable, capacitive partner element.

Surprisingly, it has been noted that there is a great advantage in choosing a first partner element that is inductive and set close to the resonant and anti-resonant frequencies. In a particular embodiment, a spiral inductor integrated directly on the silicon substrate is used.

Alternatively, the first partner element is a variable inductor set in the vicinity of the resonant and anti-resonant frequencies, according to an electric signal $V_{tune}$.

The second partner element is a capacitive element and it generally varies according to an electric signal, for example electric signal $V_{tune}$.

By controlling said electric signal $V_{tune}$ it is possible to considerably modify the characteristics of tunable resonator component composed of the acoustic resonator and its two partner elements.

Surprisingly, it was observed that the combination of partner elements chosen as mentioned above made it possible to adjust the characteristics of the TRC to a large extent, and in particular the characteristics of any integrated electronic circuit comprising such TRC, without affecting too much the overall performance of this circuit (resonant and anti-resonant frequencies, quality factor).

Then, inaccuracies in the manufacturing process and temperature sensitivity can be corrected and it is even possible to have a means for tuning the new acoustic component.

Figure 3A:
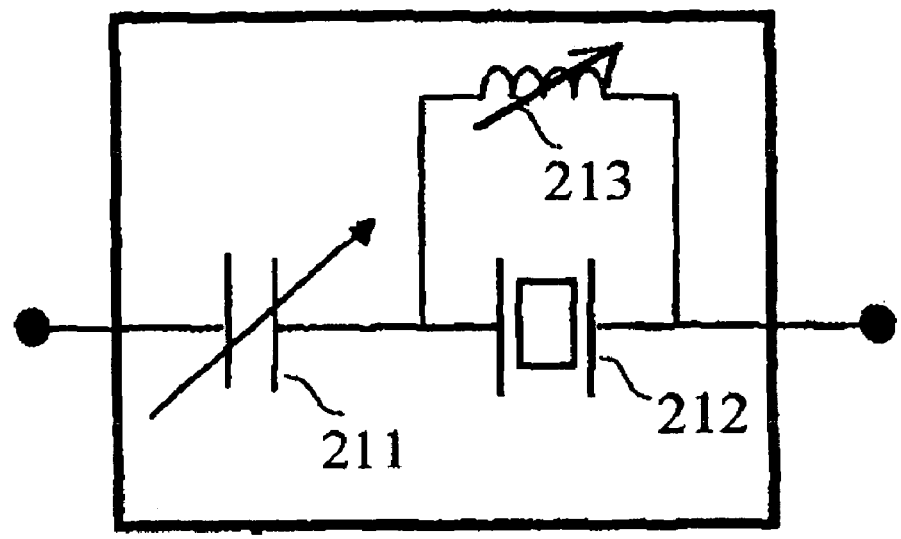
FIGS. 3a and 3b illustrate two embodiments of a tunable resonator element that is controlled by an electric signal.

FIG. 3a illustrates a first embodiment of a TRC in which the series resonance of a BAW resonator 212 is acted upon. To this end, an inductor 213 whose inductance is variable so that it can be adjusted in order to start resonating with the parallel capacitance of the resonator (which is close to frequency $f_p$) or in the vicinity of this frequency, is assembled in parallel connection with resonator 212.

It is then possible to really act on the series resonance and control the resonant frequency by means of a capacitive tuning element 211.

Figure 2C:
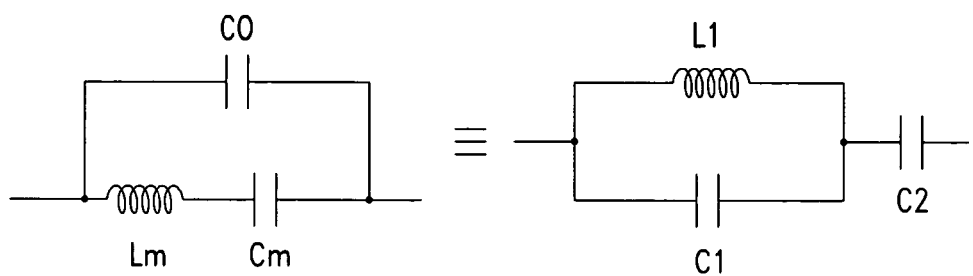
Figure 3B:
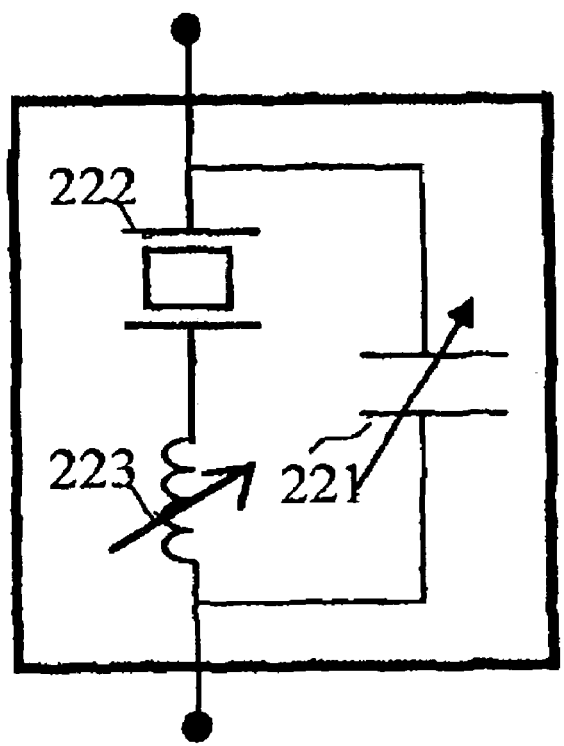

FIG. 3b corresponds to a second embodiment of a TRC in which the parallel resonance of a BAW resonator 222 is now acted upon. To this end, this time an inductor 223 that is variable in order to be adjusted so that it starts resonating with the equivalent series capacitance (C2) close to frequency $f_s$ of the resonator of the FIG. 2c, or in the vicinity of this frequency, is connected in series with resonator 222. Then, a capacitive tuning element (221) is connected in parallel with both series elements, to interact with the parallel resonance of resonator 222 and set it to frequency $f_p$.

Thus, through the combined action of partner elements 221 and 223, it is possible to adjust the operational frequency—within a broad range—by means of tuning element 211 or 221 according to the case.

Thus, there is a true co-operation between tuning element 211 (or 221) and inductor 213 (resp. 223) that, by its action in the vicinity of both resonant and anti-resonant frequencies of the acoustic resonator, reinforces the capacitive tuning effect of 211 (resp. 221).

This results in a new tunable resonator component, having a BAW resonator with a high quality coefficient, associated with its two partner elements.

Thus, great flexibility is provided by this new tunable resonator component that can be integrated into a silicon product directly. Consequently, it paves the way for new multiple developments of integrated circuits from the moment it is possible to effectively control its operation point by means of the tuning carried out by its partner elements.

Indeed, the circuit that will now be described, which allows to feedback control the operation point of the new acoustic component, not only allows to compensate for the insufficiencies of the manufacturing process, but also precisely sets the operation point in spite of temperature variations.

II. Integration of the New Tunable Resonator Element in a Master-Slave Architecture FIG. 3c illustrates a Master-Slave architecture incorporating the tunable resonator component (TRC) that makes it possible to precisely adjust the operating characteristics of any circuit incorporating said TRC component.

Figure 3C:
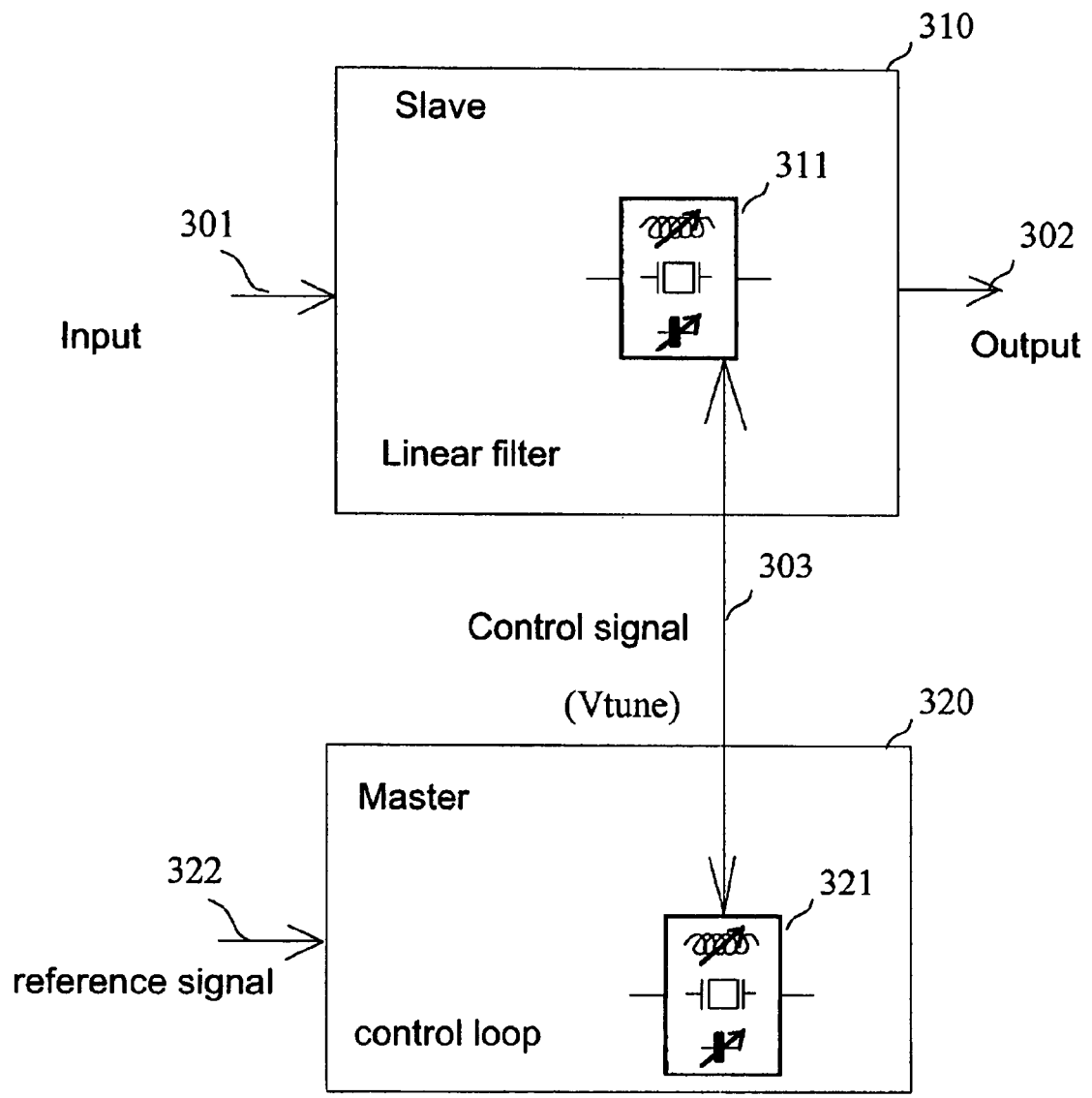
FIG. 3c illustrates the integration of a tunable resonator element in a Master-Slave architecture according to one embodiment of the present invention.

As can be seen in FIG. 3c, a TRC 311 is inserted in a circuit or block 310—a Slave block—realizing an electronic function integrated into a semiconductor product. As described previously, TRC 311 comprises a BAW resonator along with two partner elements: a first active or passive, fixed or variable, inductive element combined with a second, generally variable, capacitive element.

In a preferred embodiment, block 310 is used as an integrated linear filtering circuit using the high quality coefficient of the BAW resonator, and having an input electrode or a pair of input electrodes 301 and an output electrode or a pair of output electrodes 302.

The circuit further comprises a second circuit or block 320, a master block, linear or not linear, equipped with a second TRC 321 that is homothetic to TRC 311. To this end, the partner elements of components 311 and 321 as well as BAW resonators are paired. Specifically, BAW resonators should have the same geometry (or at least be homothetic), they should be issued from the same manufacturing process and arranged close to one another on the same substrate in order to be subjected to the same temperature conditions.

A reference value 322 that should be extremely stable, controls the second master circuit 320. In practice, for example, a reference frequency from a quartz oscillator or a reference voltage generated by a band-gap block will be selected.

Each tunable acoustic component has a control electrode receiving a controlling electric signal, which will noted $V_{tune}$, via a circuit 303.

Electric signal $V_{tune}$, voltage or current, is transmitted to one or more partner elements of each TRC.

People qualified in the art could consider various embodiments allowing to act on the partner elements of the BAW resonator.

As a non-restrictive example, in a first embodiment illustrated in FIG. 4a, the partner element of the capacitive type is a varactor receiving electric signal $V_{tune}$ to a control electrode. Thus, the value of the capacitive element associated with the BAW resonator can be adjusted.

FIG. 4b illustrates another embodiment in which the variable inductive element is built by means of an active inductor comprising a gyrator element, made up of two head-to-tail transconductance amplifiers 451 and 452 that is charged by a capacitive element 453, the second amplifier inducing a change of polarity. By acting on capacitive element 453—which could be a varactor receiving control signal $V_{tune}$, like previously—it is possible to make a variable inductive element, one electrode of which is connected to ground.

The diagram of FIG. 4c illustrates the structure of a variable floating inductive element between two electrodes 460 and 469. To this end, a first gyrator formed of two head-to-tail transconductance amplifiers 461 and 462 is inserted between electrode 460 and capacitor 453, the second amplifier inducing a change in polarity. Similarly, a second gyrator formed of two head-to-tail transconductance amplifiers 464 and 465 is inserted between electrode 469 and capacitor 453, with the second amplifier inducing polarity change.

Alternatively, the polarization current of the transconductance amplifiers forming the gyrator(s) could be controlled by electric signal $V_{tune}$, in order to adjust the gyrator's "gm" parameter and, consequently, the value of the inductive element associated with the BAW resonator.

Other embodiments allowing adjustment of the partner elements associated with resonators contained in components 311 and 321 could be considered.

It will be also noted that a single resonator component for each of circuits or blocks 310 and 320 was shown, for clarity's sake. However, it is clear that a skilled man could readily adapt the invention to the construction of a block 310 (and 320) comprising several resonator components in lattice or ladder assembly or mounted in any other possible manner.

The circuit or block 320—the master circuit—is integrated into a control circuit for precisely controlling the operation point of adjustable acoustic component 320 via electric control signal $V_{tune}$.

By copying the value to the control input of component 311 located in slave block 310, a particularly effective control of the operation point of block 310 is achieved.

The control loop produced within master block 320 makes it possible to control the characteristics of the dual component located within slave block 310, thus allowing adjustment thereof.

First, the imperfections resulting from the manufacturing process of semiconductor product can be corrected and defects in manufacturing tolerances can be compensated for. As a result it becomes possible to integrate a BAW resonator in an integrated circuit while avoiding to discard a whole circuit when only its BAW component does not show the desired characteristics.

Secondly, in addition to correcting tolerance defects, thanks to the master-slave architecture that has been just described, one controls the resonant characteristics of the resonator element by means of the control loop achieved by block 320.

This control loop allows an adjustment that is independent of the manufacturing process, and also independent of the temperature.

In order to show the great flexibility of the invention, and the multiple possibilities of control that are offered to integrated circuit designers, several particularly effective examples of control will now be described.

III. Examples of Control Loops

A. Frequency Control Through Integration of the Second TRC in a PLL Loop

FIG. 5 describes a first example of frequency control that could be used to select the WCDMA receive band. To this end, BAW resonator element 320 is integrated into a phase-locked loop (PLL).

To this end, circuit or block 320 comprises a phase comparator 510 having a first input 500 receiving a reference frequency that should be as stable as possible. Phase comparator 510 has a second input receiving the output of a dividing element 540.

The output of the phase comparator is fed to a low-pass filter 520 that outputs a voltage $V_{tune}$ used to control a TRC component 530 arranged in the master block. This voltage is used as a control signal for the dual TRC component (not shown on FIG. 5) that is located in the slave block and is used as a desired linear filter.

TRC component 530 is integrated in an oscillating system all the elements of which are paired with elements of the slave block. The oscillating system of the master block generates an output frequency that is transmitted to the dividing element 540 ensuring division by a number N equal to or higher than 1, fixed or variable, integer or fractional.

Thus, thanks to this regulation pattern, a frequency control generated by the oscillating circuit on a multiple of N times the input frequency of the master block is achieved.

This control is reproduced in the dual TRC component located in slave block 310 in order to precisely set the operation point of circuit 310, and consequently, to adjust parameters of the linear filter made up by block 310, in particular its midband frequency.

People qualified in the art will be able to adapt the teaching of the invention to the design of another type of frequency control, and in particular Frequency-Locked Loop (FLL).

More generally, multiple different control alternatives, and in particular an ALL-type control loop could be considered.

B. ALL-Type Control Loop Control

FIG. 6 illustrates a second example of a master block 320 in which an amplitude-locked loop (ALL) is advantageously carried out.

To this end, the circuit comprises a voltage comparator 610 having a first input 600 receiving a reference voltage that should be as stable as possible. Comparator 610 has a second input receiving a voltage resulting from the operation of a linear phase response circuit, as a filter, using an adjustable TRC component 630 equipped with two partner elements, as described previously.

Comparator 610 outputs an error that is filtered by a loop filter 620—generally a low-pass filter—which generates a control voltage $V_{tune}$ which is transmitted to the control electrodes of both paired TRC, respectively located in slave block 310 and master block 320.

As previously described, control voltage $V_{tune}$ could be used to control a varactor, an active inductor etc. . . . , in order to precisely adjust the operation point of the tunable resonator element in Master block 320.

The operation point of the one or more adjustable resonator components located in Slave block 310 can thus be indirectly controlled.

C. Control of the Quality Factor of the Resonator Element and of its Midband Frequency The frequency and voltage control loops that have just been described are not necessarily mutually exclusive. We will now describe how they can advantageously combine to carry out an extremely sophisticated and very advantageous control.

In this third example of control, the master circuit comprises, simultaneously, a first phase-locked loop (PLL), as previously described, associated or combined with an amplitude-locked loop (ALL) for controlling the quality factor of said TRC circuit.

To this end, one provides a first master block 710 comprising at least a first adjustable TRC 711 (similar to the previously described ones) and receiving a particularly stable reference frequency at an input 712. The first block is typically a frequency control carried out by means of a PLL loop as previously described, based on a resonant frequency.

This first master block generates a first electric control signal, $V_{tune}1$ that is transmitted to a tunable resonator element TRC 703 located in a slave block 700. As previously, slave block 700 could be used to achieve any linear filtering function, even any electric circuit.

A second master block 720 is also provided, which comprises a second tunable resonator element 721 similar to the previous one and receiving a particularly stable reference voltage at an input 722. Second block 720 is used to control the quality factor of tunable resonator element 721 in order to adjust the quality coefficient of slave resonator 703, by mirroring effect, by means of a second electric signal $V_{tune}2$.

As can be seen in FIG. 7, tunable resonator component 703 that is arranged in slave block 700 receives two electric control signals, $V_{tune}1$ and $V_{tune}2$ that can be advantageously combined to control the parameters of both inductive and capacitive partner elements.

To this end, several embodiments could be considered.

In a first mode, as represented in FIG. 8a, both electric control signals $V_{tune}1$ and $V_{tune}2$ are respectively used to control two varactors that are arranged in a stack of capacitor/varactors assembled in parallel.

Thus, a double control of adjustable resonator 703 is achieved, frequency control and quality coefficient control.

Alternatively, voltages $V_{tune}1$ and $V_{tune}2$ are used to control an active inductor, made up of a varactor and a gyrator, whose both elements are controlled by electric signals $V_{tune}1$ and $V_{tune}2$ respectively.

Such quality coefficient control and frequency control are particularly useful to maintain performances of BAW resonator 703 and to make them insensitive to manufacturing process and temperature.

IV. Integrated Heterodyne Architecture

Referring to FIG. 9, there will now be described how to combine the elements described above in order to achieve a receiving circuit based on a particularly effective heterodyne architecture which, moreover, can be completely integrated.

The circuit includes a conventional wide band antenna 21, but adapted to the frequency of the signal to receive. Downstream from the antenna, the circuit includes a first pass band filter (22) designed to receive the signal from the antenna, followed by a low noise amplifier (LNA) 23. The circuit then includes a second narrow band filter 24 which is designed for rejecting the image frequency and for selecting one particular channel within the frequency band filtered by the first filter 22.

The two filters are realized by means of BAW-type resonators, based on a tunable resonator component (TRC) as described above, which can be both integrated and each adjusted, respectively by means of a first electric signal (signal 1, $V_{tune}$ in FIG. 5) and a second electric signal (signal 2, $V_{tune}$ in FIG. 5) generated by two frequency control loop of PLL type.

The first control loop has a fixed division ratio, and this is illustrated by block 29 of FIG. 9, whereas the second frequency control loop has a variable division ratio as shown with element 30 of FIG. 9.

By adjusting the division ratio of the second control loop, it is possible to adjust the channel that is to be extracted from the considered band of frequencies.

Un-mixing circuit 25 is used for generating the intermediate frequency (IF) from the RF frequency, downstream of the second filter, and from a local oscillation frequency, whereby the signal processing can be performed on this intermediate frequency, the value of which being well inferior than the value of the frequency of the RF signal. The local oscillation frequency is also produced by the second control loop and thus also corresponds to the band of frequency being considered.

To this end, the circuit includes a block 26 which has the function of suppressing the DC component, and a variable gain amplifier (VGA) 27, as well as an analog-to-digital converter 28.

Preferably, the two filters 22 and 24 are based on the MASTER/SLAVE architecture which was described in reference with FIG. 3c.

The first pass band filter 22 is based on a slave circuit designed to provide the required transfer function and on a master circuit designed to be integrated in the first frequency control loop.

More specifically, and referring to FIG. 3c, the slave circuit includes at least a first BAW resonator 311 with a resonant and anti-resonant frequencies and associated to two partner elements, one inductive and one capacitive. One of the two partner elements is adjustable by means of said first electric signal (signal 1, $V_{tune}$).

The master circuit of the first filter includes at least a second BAW resonator located on the same substrate than the preceding one and that is associated to its two partner elements, one inductive and one capacitive. One at least of the two partner elements is adjustable by means of the first electric signal (signal 1, $V_{tune}$) generated by the first PLL-type frequency control loop.

As seen above, the control of the characteristics of the resonators can be performed by various methods. Preferably, the capacitive element—that is for instance associated to the first BAW resonator—can be a varactor controlled by the said first electric signal (signal 1, $V_{tune}$). Moreover, the inductive element comprises a spiral inductance being located on the silicium substrate of the resonator. Alternatively, the inductive element which is associated to the first or to the second resonator can be composed of a gyrateur comprising two transconductance amplifiers and a capacite, the first electric signal (signal 1, $V_{tune}$) being used for setting the operating point of the amplifiers. In another embodiment, the inductive element that is associated to the resonator is composed of a gyrator comprising two transconductance amplifiers and a varactor, with the first electric signal (signal 1, $V_{tune}$) being used for adjusting the value of the capacitance of the varactor.

Similarly, the second—narrow band pass—filter 24 is realized by means of a master/slave circuit comprising a salve circuit designed to provide the adequate transfer function and a master circuit which is to be integrated within the second control loop.

The slave circuit of the second filter comprises at least a first BAW resonator which is associated to its two partners elements, respectively inductive and capacitive. One of the element can be adjusted by means of the second electrical signal (signal 2, $V_{tune}$)

The master circuit of the second filter comprises at least a second BAW resonator that is located on the same substrate than the precedent one, and associated to its two partners elements, respectively inductive and capacitive. At least one can be adjusted by means of the second electrical signal (signal 2, $V_{tune}$) and integrated in the second frequency control loop, which has a adjustable dividing ratio for channel selection.

As for the first filter, the resonators of the master/slave circuit can be adjusted in various manners.

Thus, the first filter 22 based on a TRC is designed for selecting the whole 60 Mhz wide frequency band which is allocated to the WCDMA. As it can be seen with dividing by N block 29 of FIG. 9, the division ratio of the first frequency control loop is set to a fixed value in the preferred embodiment. The Voltage Controlled Oscillator (VCO1) (not represented in FIG. 9 for the sake of clarity but corresponding to oscillator element 530 of FIG. 5 based on a TRC component) oscillates around a frequency which value is set to coincide with the center of the bandwidth allocated to the downstream CDMA communication (for instance, $f_{osc}$=2140 Mhz for W-CDMA). It includes BAW resonators, fixed or variables capacitors (of the type varicap) and/or inductances, passive (bobines) or actives. All those elements are paired to those embodying filter 22. The control signal which is generated by the first control loop is used for controlling the variable elements of the TRC, i.e., either variable capacitors or variable active selfs as was described above with details with reference to FIG. 4a-4c and 8a-8b.

This first control loop provides the control of the transfer function of the filter 22 and permits the characteristics of said filter to be precisely set despite the inaccuracies in the manufacturing process and the temperature variations.

Preferably, filter 22 is associated to a feedback control of the quality factor, as was previously described in reference to FIG. 7. A 60 Mhz band filter can be advantageously carried out, having frequency characteristics that, for the out-of-band, show rapidly attenuating slopes thanks to the high quality factor of the BAW resonator.

The circuit shown in FIG. 9 also comprises, downstream to the filter 22, a Low Noise Amplifier 23, followed by a second filter 24 that is based on a master/slave architecture having a slave circuit that provides the adequate narrow-band transfer function. The master circuit is integrated in the second frequency control loop, having an adjustable division factor. There is thus provided an effective filter, which is capable of selecting one single 5 Mhz communication channel within the frequency band of 60 Mhz, and which is also capable of suppression the image frequency. It should be noted that, practically, narrow band filter 24 show less rapidly attenuating slopes in the out-of-band frequency characteristics as compared to filter 22.

The variable division factor (Mvar) is superior than 1 and can be adjusted by steps of 1 within the range: N–2% . . . N+2%, controlled by a BBDig block 31 which is used for the base band digital processing on the signal. The Voltage controlled Oscillator (VCO2) (which is not represented in FIG. 9 but which correspond to oscillator 530 of FIG. 5) oscillates around a frequency which is set to the center of the band width which is allocated to the downstream DCMA communication (for instance, $f_{osc}$=2140 Mhz for W-CDMA). It includes BAW resonators, fixed or variables capacitors (type varicap) and/or inductances, passive (bobines) or actives. All those elements are paired to those embodying filter 24.

The control signal which is generated by the first control loop is used for controlling the variable elements of the TCR, i.e., either variable capacitors or variable active selfs as was described above with details with reference to FIG. 4a-4c and 8a-8b.

Therefore, it is provided the effective selection of a 5 Mhz Channel within the 60 Mhz band which is allocated to the WCDMA communication.

It can thus be provided to carry out a PLL type control loop which permits the receiving channel to be selected and, also, to compensate for the variations of the temperature as well as the inaccuracies of the manufacturing process.

Generally speaking, the particular selection of one channel is made by variable dividing block 30 which is controlled by a digital block 31 in response to signaling information exchanged between the mobile and the base station. As it is known in the art, once the communication between the mobile terminal and the base station is established, the channel to be used for that communication is determined and so is the division factor to be used by block 30 under control of block 31.

In the invention, the division ratio of block 30 that is associated to the feedback control of the second filter is set as a function of the signaling procedure between the base station and the mobile terminal.

Preferably, block 30 also provides—and thus in a very advantageously way—the frequency LO of the local oscillator which is transmitted to the mixer 25 also receiving the RF frequency filtered by second filter 24.

Thus, the control of block 30 results in the simultaneous control of the selection of the channel and also the control of the frequency of local oscillator which is used by mixer 25.

Moreover, this control loop uses a input signal which servers for controlling variables elements of the BAW based narrow band filter 24 (i.e., either variable capacitors or variable active inductances) and the signal at the output of the VCO is used for generating the signal "Local oscillator" to the frequencies mixer. The requirements regarding the phase noise are those specified to the common CDMA-type receivers.

At the output of mixer 25, the intermediate frequency (IF) is transmitted to a DC block designed for suppressing the DC component.

The circuit of FIG. 9 further includes a variable gain amplifier 27, then followed by an analog to converter 28 which is used for converting the received signal in digital form.

FIG. 10 illustrates the way of operating of this architecture. As it can be seen, the wide band filter 22 attenuates down to an acceptable level all the out-of-band blockers, taking advantage of the rapidly attenuating slopes of the frequency characteristics. The narrow band filter 24 is used for selecting the sole channel which is desired. Thus, the image frequency is now easily suppressed. The input signal which is used for controlling this filter is also used for the PLL loop generating the local oscillation signal. This uniquely defines the channel selection.

It can be seen that the circuit of FIG. 9 achieves, by means of BAW acoustic resonators which can be integrated in a same semiconductor product, there is provided a complete and particularly effective architecture for a digital receiver, thanks to the high quality factor of the BAW resonators and to the efficiency of the control loops that were described.

Generally speaking, the performances that are attained result from the high quality of the adaptive control mechanism which can be carried out, thanks to the high flexibility of the TRC which was described.

A receiving circuit that based on a heterodyne architecture can be fully integrated.

Moreover, it can be noted that the heterodyne architecture which was described includes only one mixer, contrary to the known techniques which, generally speaking, are based on the successive use of two distinct mixers.

The values which are provided below are non limitative examples of possible embodiments:

For W-CDMA receivers, the frequency of the system clock is often chosen to be CLK=88.4 Mhz.

In the W-CDMA, the width of one channel is equal to 5 Mhz and the local oscillator has a step of 200 Khz.

FIG. 11 illustrates a practical example of a preferred embodiment of the two frequency control loops, respectively PLL1 and PLL2, which typically match the W-CDMA requirements:
- a dividing block 41
- a phase comparator 42
- a charge pump 43
- a filter 44
- a VCO 45 carried out with a TRC
- a dividing block 46

The signal which is entered within the PLL is set to 200 Khz, one fix the value of N=10700 and Mvar=10550 . . . 10850 with steps of 1, thus corresponding to a variation of 1.4% around the value N. The PLL1 control loop thus generates a control signal such that the frequency of the VCO is 2140 Mhz, whereas the PLL2 control loop generates a control signal such that the frequency of the VCO can be varied from 2110 Mhz to 2170 Mhz, by steps of 200 Khz.

This architecture shows the following advantages:
- a whole heterodyne receiver can be achieved with only one electronic component (dense integration);
- the selection of the channel can be uniquely performed, with a good efficiency of the rejection of the image frequency;
- the frequency scheme of the receiver can be simplified, with only one intermediate frequency being required, the value of which being higher than $B_{p\_channel}/2$.
- the insertion of the LO signal towards the antenna is significantly reduced;
- the DC offsets can be relatively easily suppressed by means of the DC block.
- the filtering process of the base band filter can be suppressed or, at least, can be significantly simplified;
- the part of the base band (after the mixer) does not present two paths in quadrature, what results in:
- no need to pair components located in the two respective paths;
- significant ease to embody the frequency mixer;
- a lower consumption of that corresponding circuit; a simplified architecture for the analog to digital converter;

The frequency synthesis blocks operate at a frequency, the value of which is in a close vicinity of the RF frequency of the useful signal (for instance, 2000 Mhz for the W-CDMA signal), and not a value which is twice the value of the incident frequency, as it is the case for IQ receivers.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A heterodyne receiving circuit for a digital communication system, comprising:

a band pass first filter receiving a signal generated by an antenna, said first filter including a first BAW-type tunable resonator component which is adjustable by a first electrical signal, said first electrical signal being generated by a first PLL-type frequency control loop;

an amplifier located downstream with respect to said first band pass filter;

a narrow band pass second filter which is located downstream with respect to said amplifier and said first filter, said second filter receiving a band of frequencies which is filtered by said first filter; said second filter including a second BAW-type tunable resonator component which is adjustable by a second electrical signal different than the first electrical signal, said second electrical signal being generated by a second PLL-type frequency control loop which has a variable division factor for selecting one particular channel within said band of frequencies;

a mixer for mixing a signal outputted by said second filter with a local oscillation frequency in order to generate an intermediate frequency; and a digital processing system for processing said intermediate frequency.

2. The heterodyne receiving circuit according to claim 1 wherein said first filter is based on a master/slave circuit which further includes:

a slave circuit that generates a transfer function of said first filter; said slave circuit having a first BAW resonator having a resonant frequency and an anti-resonant frequency, said first BAW resonator being associated with an inductive first partner element having a resonant frequency fixed in the vicinity of said resonant and anti-resonant frequencies of the first BAW resonator; and with a capacitive second partner element, at least one of the two partner elements being adjustable by said first electric signal; and a master circuit having a second BAW resonator located on a same substrate as said first BAW resonator, and having a resonant frequency and an anti-resonant frequency, said second BAW resonator being associated with an inductive third partner element having a resonant frequency fixed in the vicinity of said resonant and anti-resonant frequencies of the second BAW resonator; and with a capacitive fourth partner element, at least one of the two partner elements of the master circuit being adjustable by said first electric signal;

said second BAW resonator being integrated within said first PLL frequency control loop so as to generate said first electrical signal.

3. The heterodyne receiving circuit according to claim 2 wherein at least one of said capacitive partner elements is a varactor controlled by said first electric signal.

4. The heterodyne receiving circuit according to claim 2 wherein at least one of said inductive partner elements includes a spiral inductance located on a substrate of said first and second BAW resonators.

5. The heterodyne receiving circuit according to claim 2 wherein at least one of said inductive partner elements includes a gyrator having two transconductance amplifiers and a capacitance, said first electric signal being used for controlling operating points of said transconductance amplifiers.

6. The heterodyne receiving circuit according to claim 2 wherein at least one of said inductive partner elements includes a gyrator having two transconductance amplifiers and a varactor, said first electric signal being used for controlling a value of a capacitance of said varactor.

7. The heterodyne receiving circuit according to claim 1 wherein said second filter includes a master/slave circuit comprising:

a slave circuit for generating a transfer function of said second filter; said slave circuit having a first BAW resonator having a resonant frequency and an anti-resonant frequency, said first BAW resonator being associated with an inductive first partner element having a resonant frequency fixed in the vicinity of said resonant and anti-resonant frequencies of said first BAW resonator; and with a capacitive second partner element, at least one of the two partner elements being adjustable by said second electric signal; and a master circuit having a second BAW resonator located on a same substrate as said first BAW resonator, and having a resonant frequency and an anti-resonant frequency, said second BAW resonator being associated with an inductive third partner element having a resonant frequency fixed in the vicinity of said resonant and anti-resonant frequencies of said second BAW resonator; and with a capacitive fourth partner element, at least one of the two partner elements of the master circuit being adjustable by said second electric signal.

8. The heterodyne receiving circuit according to claim 7 wherein at least one of said capacitive partner elements is a varactor controlled by said electric signal.

9. The heterodyne receiving circuit according to claim 7 wherein at least one of said inductive partner elements includes a spiral inductance located on a substrate of said first and second BAW resonators.

10. The heterodyne receiving circuit according to claim 7 wherein at least one of said inductive partner elements includes a gyrator having two transconductance amplifiers and a capacitance, said second electric signal being used for controlling operating points of said transconductance amplifiers.

11. The heterodyne receiving circuit according to claim 7 wherein at least one of said inductive partner elements includes a gyrator having two transconductance amplifiers and a varactor, said second electric signal being used for controlling a value of a capacitance of said varactor.

12. The heterodyne receiving circuit according to claim 1 wherein said second PLL-type frequency control loop is used for generating the local oscillation frequency used by the mixer.

13. A hetero dyne receiving circuit for a digital communication system, comprising:

a band pass first filter receiving a signal generated by an antenna, said first filter including a first BAW-type tunable resonator component which is adjustable by a first electrical signal;

a narrow band pass second filter which is located downstream with respect to said first filter; said second filter including a second BAW-type tunable resonator component which is adjustable by a second electrical signal different than the first electrical signal; and a mixer for mixing a signal outputted by said second filter with a local oscillation frequency in order to generate an intermediate frequency.

14. The heterodyne receiving circuit according to claim 13 wherein said first filter is based on a master/slave circuit which further includes:

a slave circuit that generates a transfer function of said first filter; said slave circuit having a first BAW resonator having a resonant frequency and an anti-resonant frequency, said first BAW resonator being associated with an inductive first partner element having a resonant frequency fixed adjacent to said resonant and anti-resonant frequencies of the first BAW resonator; and with a capacitive second partner element, at least one of the two partner elements being adjustable by said first electric signal; and a master circuit having a second BAW resonator located on a same substrate as said first BAW resonator, and having a resonant frequency and an anti-resonant frequency, said second BAW resonator being associated with an inductive third partner element having a resonant frequency fixed adjacent to said resonant and anti-resonant frequencies of the second BAW resonator; and with a capacitive fourth partner element, at least one of the two partner elements of the master circuit being adjustable by said first electric signal.

15. The heterodyne receiving circuit according to claim 14 wherein at least one of said capacitive partner elements is a varactor controlled by said first electric signal.

16. The heterodyne receiving circuit according to claim 14 wherein at least one of said inductive partner elements includes a spiral inductance located on a substrate of said first and second BAW resonators.

17. The heterodyne receiving circuit according to claim 14 wherein at least one of said inductive partner elements includes a gyrator having two transconductance amplifiers and a capacitance, said first electric signal being used for controlling operating points of said transconductance amplifiers.

18. The heterodyne receiving circuit according to claim 14 wherein at least one of said inductive partner elements includes a gyrator having two transconductance amplifiers and a varactor, said first electric signal being used for controlling a value of a capacitance of said varactor.

19. The heterodyne receiving circuit according to claim 13 wherein said second filter includes a master/slave circuit comprising:

a slave circuit for generating a transfer function of said second filter; said slave circuit having a first BAW resonator having a resonant frequency and an anti-resonant frequency, said first BAW resonator being associated with an inductive first partner element having a resonant frequency fixed adjacent to said resonant and anti-resonant frequencies of said first BAW resonator; and with a capacitive second partner element, at least one of the two partner elements being adjustable by said second electric signal; and a master circuit having a second BAW resonator located on a same substrate as said first BAW resonator, and having a resonant frequency and an anti-resonant frequency, said second BAW resonator being associated with an inductive third partner element having a resonant frequency fixed in the vicinity of said resonant and anti-resonant frequencies of said second BAW resonator; and with a capacitive fourth partner element, at least one of the two partner elements of the master circuit being adjustable by said second electric signal.

20. A digital communication system, comprising:

an antenna that receives a communication signal and generates a corresponding signal; and a heterodyne receiving circuit coupled to the antenna and including:

a band pass first filter receiving the corresponding signal generated by the antenna, said first filter including a first BAW-type tunable resonator component which is adjustable by a first electrical signal, said first electrical signal being generated by a first PLL-type frequency control loop;

an amplifier located downstream with respect to said first band pass filter;

a narrow band pass second filter which is located downstream with respect to said amplifier and said first filter, said second filter receiving a band of frequencies which is filtered by said first filter; said second filter including a second BAW-type tunable resonator component which is adjustable by a second electrical signal, said second electrical signal being generated by a second PLL-type frequency control loop which has a variable division factor for selecting one particular channel within said band of frequencies;

a mixer for mixing a signal outputted by said second filter with a local oscillation frequency in order to generate an intermediate frequency; and a digital processing system for processing said intermediate frequency;

wherein said first filter is based on a master/slave circuit which further includes:

a slave circuit that generates a transfer function of said first filter, said slave circuit having a first BAW resonator having a resonant frequency and an anti-resonant frequency, said first BAW resonator being associated with an inductive first partner element having a resonant frequency fixed in the vicinity of said resonant and anti-resonant frequencies of the first BAW resonator; and with a capacitive second partner element, at least one of the two partner elements being adjustable by said first electric signal; and a master circuit having a second BAW resonator located on a same substrate as said first BAW resonator, and having a resonant frequency and an anti-resonant frequency, said second BAW resonator being associated with an inductive third partner element having a resonant frequency fixed in the vicinity of said resonant and anti-resonant frequencies of the second BAW resonator; and with a capacitive fourth partner element, at least one of the two partner elements of the master circuit being adjustable by said first electric signal;

said second BAW resonator being integrated within said first PLL frequency control loop so as to generate said first electrical signal.

21. The digital communication system of claim 20 wherein at least one of said capacitive partner elements is a varactor controlled by said first electric signal.

22. The digital communication system of claim 20 wherein at least one of said inductive partner elements includes a spiral inductance located on a substrate of said first and second BAW resonators.

23. The digital communication system of claim 20 wherein at least one of said inductive partner elements includes a gyrator having two transconductance amplifiers and a capacitance, said first electric signal being used for controlling operating points of said transconductance amplifiers.

24. The digital communication system of claim 20 wherein at least one of said inductive partner elements includes a gyrator having two transconductance amplifiers and a varactor, said first electric signal being used for controlling a value of a capacitance of said varactor.

25. The digital communication system of claim 20 wherein said second filter includes a master/slave circuit comprising:

a slave circuit for generating a transfer function of said second filter; said slave circuit having a first BAW resonator having a resonant frequency and an anti-resonant frequency, said first BAW resonator being associated with an inductive first partner element having a resonant frequency fixed in the vicinity of said resonant and anti-resonant frequencies of said first BAW resonator; and with a capacitive second partner element, at least one of the two partner elements being adjustable by said second electric signal; and a master circuit having a second BAW resonator located on a same substrate as said first BAW resonator, and having a resonant frequency and an anti-resonant frequency, said second BAW resonator being associated with an inductive third partner element having a resonant frequency fixed in the vicinity of said resonant and anti-resonant frequencies of said second BAW resonator; and with a capacitive fourth partner element, at least one of the two partner elements of the master circuit being adjustable by said second electric signal.

26. The digital communication system of claim 20 wherein said second PLL-type frequency control loop is used for generating the local oscillation frequency used by the mixer.

27. A hetero dyne receiving circuit for a digital communication system, comprising:

first filter means receiving a signal generated by an antenna, said first filter means including first BAW-type tunable resonator means which are adjustable by a first electrical signal, said first electrical signal being generated by first frequency control means;

amplifier means located downstream with respect to said first filter means;

second filter means located downstream with respect to said amplifier means and said first filter means, said second filter means receiving a band of frequencies which is filtered by said first filter means; said second filter means including second BAW-type tunable resonator means which are adjustable by a second electrical signal different than the first electrical signal, said second electrical signal being generated by second frequency control means which have a variable division factor for selecting one particular channel within said band of frequencies;

mixer means for mixing a signal outputted by said second filter means with a local oscillation frequency in order to generate an intermediate frequency; and digital processing means for processing said intermediate frequency.

28. The heterodyne receiving circuit according to claim 27 wherein said first filter means include a master/slave circuit which further includes:

slave circuit means for generating a transfer function of said first filter means; said slave circuit means having a first BAW resonator having a resonant frequency and an anti-resonant frequency, said first BAW resonator being associated with an inductive first partner element having a resonant frequency fixed adjacent to said resonant and anti-resonant frequencies of the first BAW resonator; and with a capacitive second partner element, at least one of the two partner elements being adjustable by said first electric signal; and a master circuit means having a second BAW resonator located on a same substrate as said first BAW resonator, and having a resonant frequency and an anti-resonant frequency, said second BAW resonator being associated with an inductive third partner element having a resonant frequency fixed adjacent to said resonant and anti-resonant frequencies of the second BAW resonator; and with a capacitive fourth partner element, at least one of the two partner elements of the master circuit means being adjustable by said first electric signal.

29. The heterodyne receiving circuit according to claim 27 wherein said second filter means include a master/slave circuit comprising:

slave circuit means for generating a transfer function of said second filter means;

said slave circuit means having a first BAW resonator having a resonant frequency and an anti-resonant frequency, said first BAW resonator being associated with an inductive first partner element having a resonant frequency fixed adjacent to said resonant and anti-resonant frequencies of said first BAW resonator; and with a capacitive second partner element, at least one of the two partner elements being adjustable by said second electric signal; and master circuit means having a second BAW resonator located on a same substrate as said first BAW resonator, and having a resonant frequency and an anti-resonant frequency, said second BAW resonator being associated with an inductive third partner element having a resonant frequency fixed in the vicinity of said resonant and anti-resonant frequencies of said second BAW resonator; and with a capacitive fourth partner element, at least one of the two partner elements of the master circuit means being adjustable by said second electric signal.

30. The heterodyne receiving circuit according to claim 27 wherein said second frequency control means are used for generating the local oscillation frequency used by the mixer means.

* * * * *

UNITED STATES PATENT AND TRADEMARK OFFICE
CERTIFICATE OF CORRECTION

PATENT NO. : 7,623,837 B2  Page 1 of 1
APPLICATION NO. : 11/125291
DATED : November 24, 2009
INVENTOR(S) : Andreia Cathelin et al.

It is certified that error appears in the above-identified patent and that said Letters Patent is hereby corrected as shown below:

Column 16
Line 10 Claim 13, "A hetero dyne receiving" should read as --A heterodyne receiving--

Column 18
Line 51 Claim 27, "A hetero dyne receiving" should read as --A heterodyne receiving--

Signed and Sealed this

Twenty-second Day of June, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,623,837 B2 | Page 1 of 1 |
| APPLICATION NO. | : 11/125291 | |
| DATED | : November 24, 2009 | |
| INVENTOR(S) | : Cathelin et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1221 days.

Signed and Sealed this

Fifth Day of October, 2010

David J. Kappos
*Director of the United States Patent and Trademark Office*